United States Patent [19]

Chang et al.

[11] Patent Number: 5,426,325
[45] Date of Patent: Jun. 20, 1995

[54] METAL CROSSOVER IN HIGH VOLTAGE IC WITH GRADUATED DOPING CONTROL

[75] Inventors: Mike F. Chang, Cupertino; King Owyang, Atherton; Richard K. Williams, Cupertino, all of Calif.

[73] Assignee: Siliconix Incorporated, Santa Clara, Calif.

[21] Appl. No.: 101,886

[22] Filed: Aug. 4, 1993

[51] Int. Cl.6 .............. H01L 29/10; H01L 29/38
[52] U.S. Cl. ...................... 257/408; 257/655; 257/776; 257/335; 257/339; 257/500
[58] Field of Search ............. 257/655, 657, 611, 776, 257/328, 335, 339, 340, 488, 494, 495, 500

[56] References Cited

U.S. PATENT DOCUMENTS 4,933,730  6/1990  Shirato ........................... 357/23.4
5,132,753  7/1992  Chang et al. .................... 357/23.4

OTHER PUBLICATIONS

IBM Technical Disclosure Bulletin, vol. 22, No. 11, Apr. 1980, pp. 5146–5147.

*Primary Examiner*—Robert P. Limanek
*Assistant Examiner*—David B. Hardy
*Attorney, Agent, or Firm*—Skjerven, Morrill, MacPherson Franklin & Friel; David E. Steuber; David T. Millers

[57] ABSTRACT

Non-uniformly doped regions are formed adjacent to semiconductor junctions which underlie high voltage crossovers. The non-uniformly doped regions prevent junction breakdown caused by strong electric fields. The voltage drop between a crossover and an element of an integrated circuit is spread over the non-uniformly doped region, to lessen the voltage drop between the crossover and the junction and lessen the electric field at the junction. Dopant concentrations in the non-uniformly doped region may be selected to minimize use of silicon real estate. In some embodiments, a graded dopant concentration is lightest near the junction and increases toward a circuit element being protected.

16 Claims, 3 Drawing Sheets

METAL CROSSOVER IN HIGH VOLTAGE IC WITH GRADUATED DOPING CONTROL

BACKGROUND OF THE INVENTION

1. Field of the Invention

This invention relates to crossover interconnects used in high voltage integrated circuits and structures that prevent junction breakdown caused by high voltage differences between the crossovers and underlying semiconductor junctions.

2. Description of Related Art

High voltage integrated circuits are useful in many applications including power ICs. In a typical high voltage IC, the voltage difference between two junctions formed in the same semiconductor can be high. For example, in a power IC which supplies power to a household appliance, voltages differences of 110 volts AC (or about 500 volts absolute) are common. In other applications, voltage differences are even higher. High voltage differences cause strong electric fields in the semiconductor and can cause junction breakdown. Consequently, two circuit elements in a high voltage IC that have a high voltage difference must be separated or shielded from each other.

FIG. 1 shows a typical pair of doped regions 101 and 102 formed in a semiconductor substrate 100 as part of a high voltage IC. When the region 101 is at a low voltage level, zero volts, and the region 102 is at a high voltage, such as 500 volts, there is a large voltage drop between the junctions 121 and 122. The voltage drop causes an electric field which forms in a region 103 between the junctions. The electric field and the change in voltage are related by the equation $\Delta V = \int E \cdot dx$. With a fixed voltage, increasing the distance between the junctions decreases the magnitude of the electric field. If the electric field near the junction 121 or 122 is weak enough a depletion region around the junctions 121 and 122 prevents unwanted current from flowing. If the electric field gets too strong near a junction 121 or 122, junction breakdown occurs and unwanted current flows.

The problem of junction breakdown becomes worse when high voltage crossovers are used. In FIG. 1, the doped regions 101 and 102 underlie a crossover 104 which is separated from the regions 101 and 102 by an insulating layer 106. Crossovers are generally made of metal or some other conductor and therefore have substantially uniform voltage along their lengths. However, the voltage level on the crossover may vary with time. For example, the voltage on the crossover 104 may change with time back and forth between 0 and 500 volts.

If, for example, the region 101 is at 0 volts, the region 102 is at 500 volts, and the crossover is at 0 volts, the voltage drop along a path 105 through the insulating layer 106 is 500 volts $= \Delta V = \int E \cdot dx$. Because a large voltage drop takes place over a short distance, the electric field along the path 105 and at the junction 122 is strong, and a junction breakdown may occur. The breakdown problem is exacerbated by an image charge formed near the surface of the semiconductor caused by the crossover 104. The image charge aids current flow between the regions 101 and 102 if junction breakdown occurs. If the voltage on the crossover goes to 500 V, the electric field near the junction 122 is weak, but a strong electric field near the junction 121 may cause a breakdown similar to that discussed above.

The problem of junction breakdown caused by high voltage crossovers is critical in high voltage ICs, because use of crossover interconnects are an efficient way to connect elements of an IC. Many solutions have been tried to address the junction breakdown problem.

One solution uses individual wire bondings to make connections between elements. Connection wires which connect from bond to bond can be kept at a greater distance from the junctions. However, individual wire bondings for every structure that requires an interconnect makes manufacturing complicated and expensive.

Another solution is routing the high voltage interconnects to avoid junctions that may be affected. This solution wastes silicon "real estate" because junctions must often be widely separated to provide paths for the interconnects. The paths are often complicated and convoluted.

Conducting field plates have also been used. Field plates may be floating or set to the voltage of a junction. The field plates are placed between the junction and the crossover. A strong electric field develops between the field plate and the crossover, but if the field plate is properly designed, the junction is shielded from the strongest electric fields and breakdown is prevented. The primary disadvantage of field plates is the cost of additional steps required to manufacture a high voltage IC and that the available oxide thicknesses in the process may be incompatible with those thicknesses desired for high breakdown voltage devices.

Semi-Insulating Poly Oxide Silicon (SIPOS) layers have also been used to prevent breakdown. SIPOS layers are placed in contact with the region surrounding the junction. When a crossover generates an image charge adjacent to a junction, the SIPOS drains excess charge away and prevents a strong electric field from forming in the area of the junction. The disadvantages of SIPOS are the extra manufacturing steps required to fabricate the high voltage IC and the power lost during operation from the current flowing in the SIPOS layer.

SUMMARY OF THE INVENTION

In one embodiment of the present invention, junction breakdown caused by high voltage crossover interconnects is prevented by forming a lightly doped region in which the concentration of the dopant is graduated. The graded dopant concentrations block the effects of large voltage differences between a crossover interconnect and underlying silicon. The dopant concentrations are tailored to minimize use of silicon area. In particular, the concentration may be graded to provide higher dopant concentration near a contact region and a relatively low concentration near a junction. The graduated region spreads the voltage change over the length of the region, and thereby prevents strong electric fields which cause junction breakdown. Graduating the dopant concentration makes for a very efficient use of the limited area available on the IC, as compared with the uniformly doped drift regions known in the prior art.

In another embodiment, graduated regions are provided for a p-type and an n-type region which would be affected by a conducting crossover. Provision of graduated regions prevents junction breakdown regardless of whether the crossover is at a high voltage or a low voltage, or whether it alternates between the two.

The graduated region is preferably formed by doping multiple zones, each zone having a different depth. Diffusion during thermal processes connects the zones together but leaves the highest dopant dose in the widest zones. The graduated regions can be formed during the same masking and doping steps that form other elements of the IC. The expense of forming the graduated regions is therefore negligible. Further, the graded LDDs do not cause or permit a power wasting current such as in SIPOS layers.

DETAILED DESCRIPTION OF THE PREFERRED EMBODIMENTS

Figure 1:
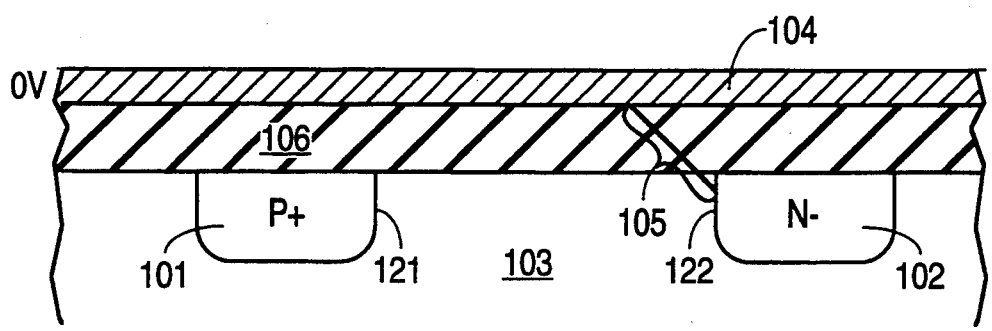
FIG. 1 shows a cross-sectional view of a crossover and a pair of doped regions formed in a semiconductor as part of a prior art integrated circuit.
Figure 2:
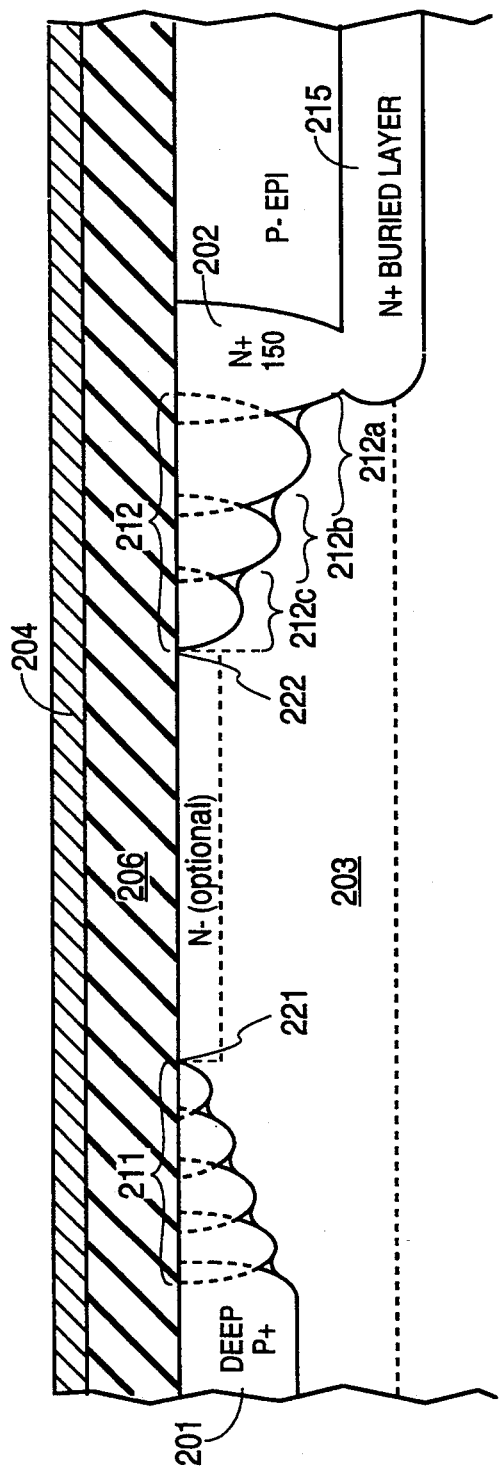
FIG. 2 shows a cross-sectional view of a crossover and a pair of doped regions with a graded, lightly doped regions in accordance with the present invention.

FIG. 2 shows a high voltage IC with a p+ region 201 and an n+ isolation region 202 which are formed in an epitaxial layer 203 of a p-substrate using methods well known to those skilled in the art. The conductivity types shown in FIG. 2 are illustrative, and those skilled in the art will appreciate that n-substrate could also be used.

Adjacent to the p+ region 201 is a lightly doped region 211. The lightly doped region 211 has a graduated concentration of p type dopants that drops with distance from the p+ region 201. In a typical embodiment, the region 211 has dopant concentration that varies from $1 \times 10^{14}$ cm$^{-3}$ to $1 \times 10^{19}$ cm$^{-3}$. At the edge of the region 211 is a junction 221 between different dopant concentration regions in the epitaxial layer 203.

Adjacent to the n+ region 202 is a graduated, lightly doped region 212, and at the edge of the lightly doped region 212 is a junction 222.

Above the substrate 203 and the regions 201, 211, 202, and 212 is an insulating layer 206. The insulating layer 206 is formed using methods well known to those skilled in the art and may be made of silicon dioxide or any of a number of known insulators used in the fabrication of integrated circuits. Above the insulating layer 206 is a conducting crossover 204 which is metal and formed using well known techniques. In other embodiments, the crossover 204 may also be made of other conducting materials such as doped polycrystalline silicon.

In a typical high voltage IC, the p+ region 201 may be formed as part of a circuit element that operates at voltages within a few volts of the low voltage, such as 0 V. The n+ isolation region 202 may include a buried layer 215 and may operate near a high voltage, such as 500 volts. Isolation region 202 may enclose other integrated circuit elements (not shown) that operate within a few volts of the high voltage. The present invention is not restricted to any particular voltages but is applicable to any voltage where junction breakdown is a potential problem.

With the n+ region 202 at the high voltage, the region 212 is also at a relatively high voltage, and a depletion region is established in the substrate 203 near the junction 222 as majority carriers in the p-substrate (holes) are pushed away from the positive voltage. The depletion region in region 212 extends from junction 222. The exact extent of the depletion region depends on the magnitude of voltage difference. As long as the electric field near the junction 222 is not too strong, the depletion region prevents a current from flowing between the regions 201 and 202.

The crossover 204, being metal or another good conductor, has a substantially uniform voltage along its length. However, the voltage on the crossover 204 may switch between the high voltage and the low voltage during operation of the IC. When the voltage on the crossover 204 is at or near zero volts there is a large voltage difference between the crossover 204 and the regions 202 and 212. But the voltage difference is spread out through the region 212 and the insulator 206, as described below, so the electric field at the junction 222 is too weak to cause a breakdown.

In FIG. 2, the region 202 and the graduated region 212 together form an n region with nonuniform conductivity. The graduated region 212 is divided into zones 212a, 212b, and 212c, each zone having a different dopant concentration. The dopant concentration and conductivity decreases from zone 212a to zone 212b, and from zone 212b to zone 212c. The number of different zones, such as 212a, 212b, and 212c, having different dopant concentration, is not limited to any specific number, and can be expanded as desired.

Where conductivity is high, charges are relatively free to move to cancel out electric fields. The n+ region 202 has high conductivity and a nearly uniform voltage at the high voltage, 500 volts. The zone 212a has a lower conductivity. Therefore, the voltage in the zone 212a is not as uniform. There is a voltage drop across the zone 212a that depends on the conductivity of the zone 212a. Zones 212b and 212c have progressively lower conductivities and greater voltage drops than the zone 212a.

In the graduated region 212, depletion of mobile charges in the space change layer leaves behind fixed charges. These fixed charges lower the voltage at the junction 222 from the high level, 500 volts, to some intermediate value, less than 500 volts. The voltage difference across the junction 222 is less than the voltage difference between the crossover 204 and the n+ region 202. This lower voltage difference prevents junction breakdown. The magnitude and distribution of the voltage drops depend on the distribution of charge in the regions 211 and 212, which in turn depends on the dopant concentration in the regions. Using a graduated dopant concentration in the region 212 permits the dopant concentrations to be tailored so as to minimize the area of the IC required for blocking crossover voltages.

When the crossover 204 is at the high voltage 500 V, the electric field caused by the crossover 204 is weak near region 202, but strong near the p+ region 201. In a manner similar to that described above, breakdown is prevented at junction 221 by voltage drops in the graduated region 211. By providing two graduated regions 211 and 212, junction breakdown is prevented regardless of whether voltage on the crossover 204 is high or low.

In general, regions 201 and 202 are formed with conductivity according to the requirements of a circuit element being formed, and the graduated regions 211 and 212 are formed with size and conductivity needed to spread out the electric field caused by the crossover 204.

There are many ways to create the nonuniform doping profile in the regions 211 and 212. One method uses the implant mask 300 shown in FIG. 3. In mask 300, openings 302, 312a, 312b, and 312c are used to form the n type regions 202 and n type zones 212a, 212b, and 212c in the epitaxial layer 203. When a beam of n type dopant ions is directed at mask 300, the widths of openings 302, 312a, 312b, and 312c determine the number of ions allowed through the mask, and thereby determine the concentration of ions implanted in the epitaxial layer 203.

Figure 3:
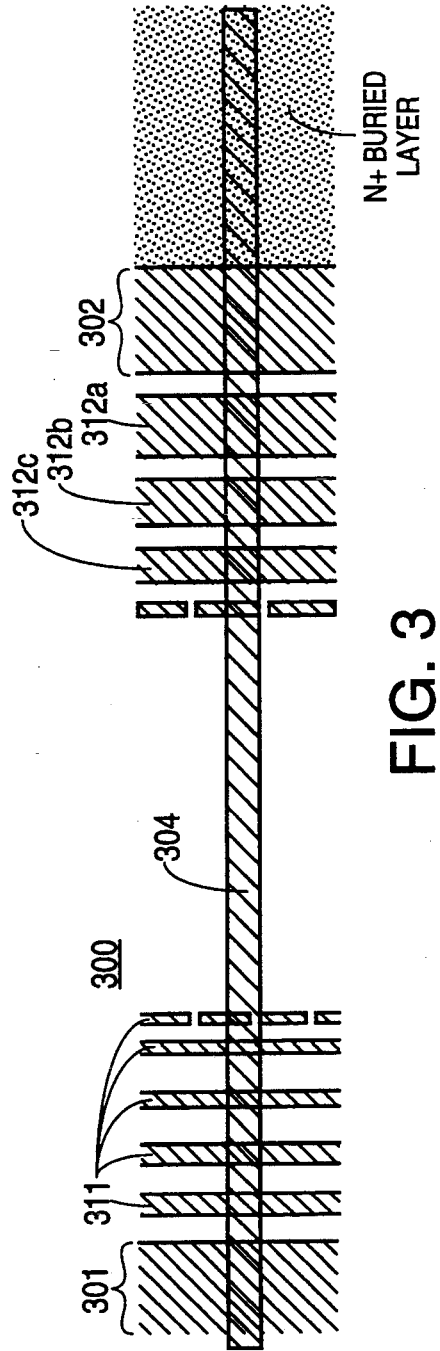
FIG. 3 shows a top view of masks used to form the regions shown in FIG. 2.

In the mask shown in FIG. 3, the width of the openings decreases with distance from the opening 202 and causes a decreasing dopant concentration. Subsequent heating of the layer 203 causes dopants to defuse so that the dopant concentration in the region 212 varies along a relatively linear gradient. The p type regions 201 and 211 are formed in a similar manner using openings 301 and 311.

Figure 4:
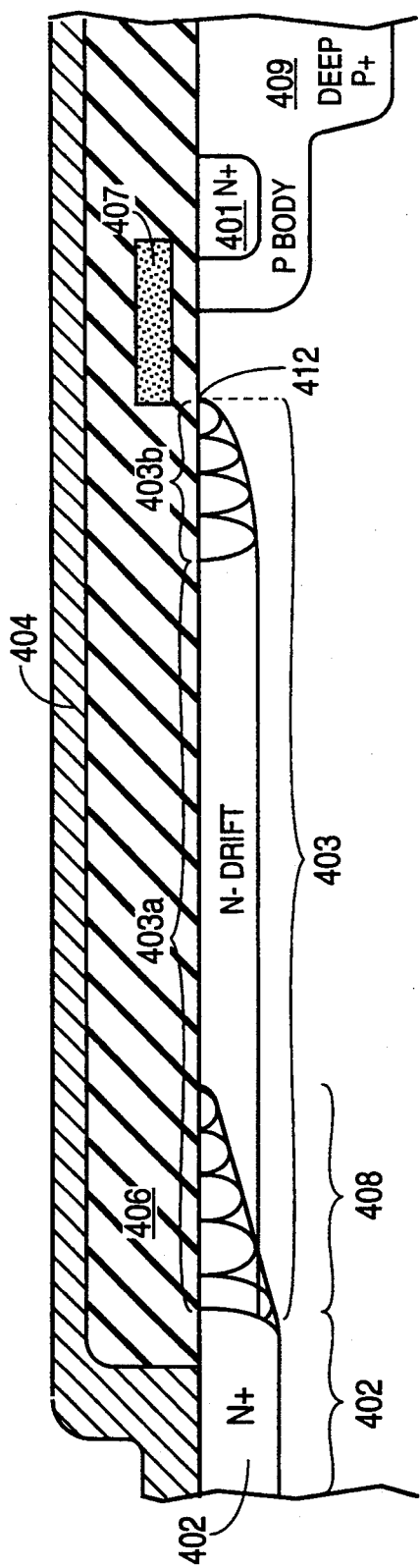
FIG. 4 shows a cross-sectional view of a crossover and a high voltage field effect transistor having a graduated drift region according to the present invention.

FIG. 4 shows a high voltage field effect transistor (FET) including a graduated drift region of the present invention. The high voltage FET shown has a source and a drain formed as n+ regions 401 and 402, and a gate 407 of polycrystalline silicon. Adjacent to the n+ region is a graduated LDD region 403. A junction 412 borders graduated drift region 403. A conducting crossover interconnect 404, typically made of metal, is in electrical contact with the region 402 and crosses over the graduated drift region 403, the junction 412, and the gate 407. An insulating layer 406 separates the crossover 404 from the underlying regions.

In the high voltage FET, a high voltage difference, 500 V, may exist between n+ region 401 and n+ region 402. Being in electrical contact, the n+ region 402 and the crossover interconnect 404 are at substantially the same voltage, at or near the high voltage 500 V. However, the voltage in the graduated drift region 403 falls with distance from the region 402. The voltage drop along the length of the graduated drift region 403 is necessary to prevent breakdown at the junction 412 caused by the large voltage drop from n+ region 402 to n+ region 401. The doping of region 408 near the n+ region 402 can optionally be graduated, as described in U.S. Pat. No. 5,132,753. The optional dopant graduation is beneficial and may be fabricated with the mask as described below.

The junction 412 is subjected both to the low voltage at 401 and the high voltage on the crossover interconnect 404. To prevent the formation of a large electric field at the junction 412 caused by the crossover interconnect 404, the drift region 403 includes a region 403b which has a graduated dopant concentration. The voltage drop from the crossover interconnect 404 is spread over the insulating layer 406 and the region 403b so that the electric field is weaker at the junction 412 than it would be absent the region 403b.

Figure 5:
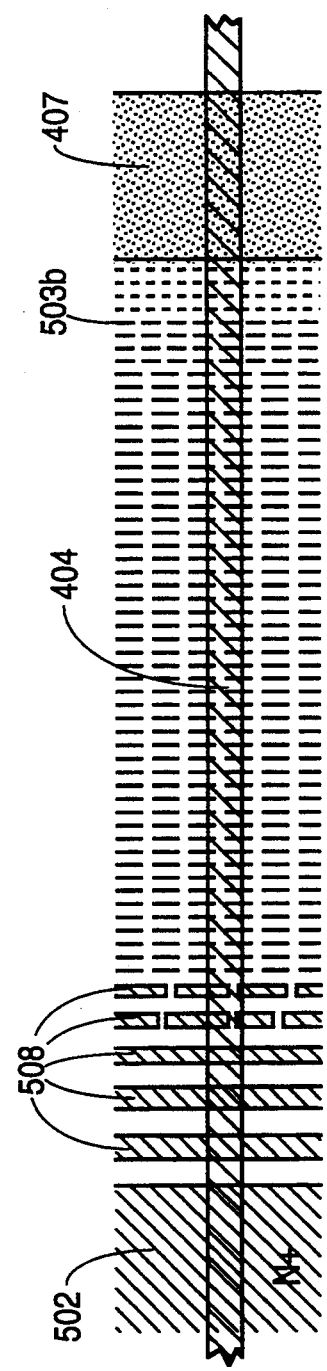
FIG. 5 shows a mask layer which may be use in forming of the drift region of FIG. 4.

FIG. 5 shows a mask layer which is used with the method described above to form the n+ region 402, the drift region 403 and the graded regions 408 and 403b. FIG. 5 also shows the relative positions of the crossover interconnect 404 and the gate 407 of the high voltage FET. The size of openings 502, 508, and 503b controls the number of dopant ions that reach the substrate and controls the dopant concentration. Between the regions 508 and 503b the drift region 403a may be uniformly and very lightly doped having a dopant concentration lighter than either region 508 or 503b. As described above, heating of the substrate causes diffusion of the dopants to create a more uniform dopant concentration profile.

Although the present invention has been described in detail, the description is only an example of the invention's application and should not be taken as a limitation. In particular FIG. 2 shows the same crossover affecting the two junctions 221 and 222. However, other embodiments of the invention include implementations to prevent current between junctions that are close to different crossovers. Also as will be recognized by those skilled in the art, the non-uniform doped regions may be combined with prior art methods to further increase resistance to high voltage effects. In particular, a non-uniform doped region may be combined with a shielding field plate or SIPOS layer to further reduce the effect of a crossover. The scope of the present invention is determined only by the following claims.

We claim:

1. An integrated circuit, comprising:
   a first doped region formed in a semiconductor;
   a conducting crossover having a first portion overlying an edge of the first doped region;
   a first lightly doped region formed in the semiconductor, adjacent to the edge of the first doped region, the first lightly doped region having a non-uniform dopant concentration; and
   a first junction at an edge of the first lightly doped region and underlying the conducting crossover, wherein during operation of the integrated circuit, the first lightly doped region prevents voltage differences between the conducting crossover and the first doped region from causing a junction breakdown at the first junction.

2. The integrated circuit of claim 1, further comprising:
   a second doped region formed in the semiconductor, the second doped region having an edge underlying a second portion of the conducting crossover;
   a second lightly doped region formed in the semiconductor, adjacent to the edge of the second doped region, the second lightly doped region having a non-uniform dopant concentration; and
   a second junction at an edge of the second lightly doped region and underlying the conducting crossover, wherein during operation of the integrated circuit, the second lightly doped region prevents voltage differences between the conducting crossover and the second doped region from causing a junction breakdown at the second junction.

3. The integrated circuit of claim 2, wherein the first and the second doped regions are of different conductivity types.

4. The integrated circuit of claim 3, wherein the first lightly doped region has the same conductivity type as the first doped region, and the second lightly doped region has the same conductivity type as the second doped region.

5. The integrated circuit of claim 4, wherein the first and second lightly doped regions have graduated dopant concentrations.

6. The integrated circuit of claim 1, further comprising an insulating layer formed between the first doped region and the conducting crossover.

7. The integrated circuit of claim 6, wherein the conducting crossover is a metal line.

8. The integrated circuit of claim 1, wherein the first lightly doped region comprises a plurality of zones, each zone having a different dopant concentration.

9. The integrated circuit of claim 1, wherein the first lightly doped region has a dopant concentration that is graduated.

10. The integrated circuit of claim 9, wherein the first lightly doped region has a dopant concentration that is highest adjacent to the first doped region and decreases as distance from the first doped region increases.

11. An integrated circuit, comprising:
a semiconductor substrate;
first and second circuit elements at least partially formed in the semiconductor substrate;
an insulating layer overlying the semiconductor substrate;
a conducting crossover interconnect overlying the insulating layer, the conducting crossover interconnect being in electrical contact with the first circuit element;
a doped region disposed in the semiconductor substrate; and
a lightly doped region disposed in the semiconductor substrate, adjacent to the doped region, between the doped region and a portion of the semiconductor substrate directly underlying the conducting crossover interconnect, the lightly doped region having a non-uniform dopant concentration.

12. The integrated circuit of claim 11, further comprising a junction at an edge of the lightly doped region, wherein the dopant concentration of the lightly doped region prevents expected operating voltage differences between the conducting crossover interconnect and the doped region from causing a junction breakdown at the junction.

13. The integrated circuit of claim 12, wherein the conducting crossover interconnect is a metal line.

14. The integrated circuit of claim 12, wherein the lightly doped region comprises a plurality of zones, each zone having a different dopant concentration.

15. The integrated circuit of claim 12, wherein the lightly doped region has a dopant concentration that is graduated.

16. The integrated circuit of claim 15, wherein the lightly doped region has a dopant concentration that is highest adjacent to the doped region and decreases as distance from the doped region increases.

* * * * *

UNITED STATES PATENT AND TRADEMARK OFFICE
CERTIFICATE OF CORRECTION

PATENT NO.   :   5,426,325
DATED        :   June 20, 1995
INVENTOR(S)  :   Mike F. Chang, King Owyang and Richard K. Williams It is certified that error appears in the above-identified patent and that said Letters Patent are hereby corrected as shown below:

Col. 2, line 5, after "interconnects" insert --104--.

Col. 2, line 50, delete "graded" and insert "graduated--.

Col. 4, line 44, delete "change" and insert --charge--.

Col. 5, line 29, delete "LDD" and insert --drift--.

Signed and Sealed this

Ninth Day of April, 1996

Attest:

BRUCE LEHMAN

*Attesting Officer*   *Commissioner of Patents and Trademarks*